United States Patent [19]
Murray

[11] Patent Number: 5,168,543
[45] Date of Patent: Dec. 1, 1992

[54] DIRECT CONTACT HEATER FOR VACUUM EVAPORATION UTILIZING THERMAL EXPANSION COMPENSATION MEANS

[75] Inventor: Richard A. Murray, Kent, Wash.

[73] Assignee: The Boeing Company, Seattle, Wash.

[21] Appl. No.: 681,853

[22] Filed: Apr. 5, 1991

[51] Int. Cl.[5] .......................... C23C 14/00; B01B 7/00
[52] U.S. Cl. .................................... 392/388; 118/726; 338/316
[58] Field of Search ...................... 392/388, 389, 399; 118/726, 727, 725, 724; 219/427; 338/316; 92/47, 34-35; 165/104.26

[56] References Cited

U.S. PATENT DOCUMENTS

| | | | |
|---|---|---|---|
| 2,489,753 | 11/1949 | Cox | 392/478 |
| 2,730,986 | 1/1956 | Patton | 118/726 |
| 2,984,807 | 5/1961 | Blum | 338/316 |
| 3,178,913 | 4/1965 | Olson | 219/543 |
| 3,408,608 | 10/1968 | Chikinev | 338/316 |
| 3,957,107 | 5/1976 | Altoz et al. | 165/104.26 |
| 4,313,492 | 2/1982 | Andros et al. | 165/104.26 |
| 4,607,152 | 8/1986 | Allovon et al. | 118/727 |
| 4,748,315 | 5/1988 | Takahashi et al. | 219/424 |
| 4,803,343 | 2/1989 | Sotani et al. | 219/430 |
| 4,813,476 | 3/1989 | Mahefkey | 165/104.26 |

FOREIGN PATENT DOCUMENTS

| | | | |
|---|---|---|---|
| 53-128585 | 11/1978 | Japan | 118/50.1 |
| 56-165895 | 12/1981 | Japan | 165/104.26 |
| 2-111873 | 4/1990 | Japan | 118/726 |
| 410580 | 10/1966 | Switzerland | 118/726 |
| 1169517 | 11/1969 | United Kingdom | 392/389 |

OTHER PUBLICATIONS

"Source Evaporant Systems for Thermal Evaporation", Archibald et al., Solid St. Technology, vol. 19, No. 7, pp. 32-40, Jul. 1976.
Mickelsen et al., "Large Area CuInSe$_2$ Thin-Film Solar Cells," *Proceedings of the Nineteeneth IEEE Photovoltaic Specialists Conference*, New Orleans, La., May 4-8, 1987, pp. 744-748.
Physical Vapor Deposition, 1976, Airco, Inc., pp. 16-17.
"Vacuum Evaporation," *Handbook of Thim Film Technology*, Maissel & Glang, McGraw-Hill, N.Y. 1970, pp. 1-7 and 1-8.
Mickelson et al., "Development of Thin-Film CuInSe$_2$ Solar Cells, Invited Paper," High Technology Center, Boeing Electronics Company, Seattle, Wa. 98124, pp. 39-47.
L. Holland, "Metal Foil Heaters," Vacuum Deposition of Thin Films, London 1966, pp. 118-121.
Miniflex Corporation Catalogue, 3 pages.

*Primary Examiner*—Teresa J. Walberg
*Assistant Examiner*—John A. Jeffery
*Attorney, Agent, or Firm*—Christensen, O'Connor, Johnson & Kindness

[57] ABSTRACT

An apparatus for evaporating materials to be deposited onto a substrate provides heat directly to the material to be evaporated by conduction and includes a means for compensating for thermal expansion and contraction of the heat source during thermal cycling. Direct heating provides a quicker response time which is critical for effective performance when making thin film semiconductors by elemental evaporation in a high vacuum chamber. Compensating for expansion leaves the heater uniform, devoid of hot or cold spots encountered when conventional heater elements buckle during thermal cycling.

24 Claims, 4 Drawing Sheets

DIRECT CONTACT HEATER FOR VACUUM EVAPORATION UTILIZING THERMAL EXPANSION COMPENSATION MEANS

FIELD OF THE INVENTION

The present invention relates to a crucible for the vapor deposition of semiconductive and non-conductive films onto substrates, and more particularly to controllable heaters.

BACKGROUND OF THE INVENTION

Films are used industrially for antireflection coatings, front surface mirrors, interference filters, sunglasses, or decorative coatings on plastic and textiles; in the manufacture of cathode ray tubes; in electronic circuits; in the production of magnetic films for computer information storage; and in the production of photovoltaic cells. One way to produce thin films is using a technique known as vacuum evaporation.

Although commonly referred to as a single process, the deposition of thin films by vacuum evaporation consists of several distinguishable steps:
1. Producing vapor;
2. Conveying vapor from the source to the substrate; and
3. Condensing the vapor on the substrates.

Thin film photovoltaic cells can be produced by elemental coevaporation. To obtain the desired film composition, the evaporation rates of the materials must be accurately controlled. As the scale of the production process increases and the volume of the source for the evaporated material increases, it becomes increasingly more difficult to control the evaporation rates accurately. The larger volumes of elemental evaporants and size of heating equipment contribute to the difficulty in controlling the evaporation rates precisely.

The energy needed for evaporation can be provided by resistance heating, electrical induction, lasers, electron bombardment, or a combination of these means. In one prior art system, a tantalum foil heater provides indirect radiant energy to a vessel that contains the material to be evaporated. An insulating gap separates the heater from the vessel. The ends of the tantalum heater are attached to rigid electrical contacts. Adjustments of the power control for the heater are common to control the energy produced by the heater. One drawback of this system is its inability to quickly translate adjustments in the power control to changes in the temperature of the material being evaporated. Also, since the ends of the tantalum heater are attached to rigid electrical contacts, during thermal cycling, the heater can buckle and crack due to stresses induced by thermal expansion and compression. Cracking of the heater varies the the resistance of the heater which results in current fluctuation and an inability to predictably control the amount of energy produced by the heater.

To obtain accurate control of the evaporation rate from a resistance heat source, it is desirable to overcome such problems. A resistance heat source should enable the user to quickly change the temperature of the material being evaporated by controlling the input power. To provide a heat source that provides a relatively constant and predictable current, cracking of the heater should be avoided.

SUMMARY OF THE INVENTION

The present invention is a controllable crucible and a method for evaporating a material, that accurately and quickly translate adjustments in input power to changes in the temperature of the material to be evaporated. The apparatus achieves this objective by using a heat source that is in direct contact with the material. The heat source mechanically compensates for thermal expansion and contraction during thermal cycling.

The crucible formed in accordance with the present invention for evaporating a material includes an electric heat source. The fractional change in the length of the heat source per degree change in temperature (L/°C.) is less than the coefficient of thermal expansion (CTE) of the heat source. In a preferred embodiment, the heat source includes a mechanical compensating means having convolutions (i.e., a bellows) that allow the heat source to expand and compress during thermal cycling.

Another inventive aspect of the apparatus formed in accordance with the present invention is that the electric heat source is in direct contact with the material to be evaporated so that a change in the heat output of the heat source is quickly translated into a change in the temperature of the evaporating material and its evaporation rate. The reaction time is reduced to allow better control of the evaporated materials temperature.

The present invention also relates to a method for evaporating a material. The method includes a step of directly contacting the material with an electric heat source. In one embodiment, the method can be used to evaporate a semiconductive material such as selenium for deposition as a thin film on a substrate of a photovoltaic cell.

In a preferred embodiment, the heat source includes a nozzle that allows the evaporated material to escape the heat source. The nozzle is provided with an electric means for adjusting the temperature of the nozzle. Adjustment of the nozzle temperature is desirable to prevent premature condensation of the evaporated material onto the nozzle.

BRIEF DESCRIPTION OF THE DRAWINGS

The advantages of this invention will become more readily apparent by reference to the following Detailed Description of the Invention, in conjunction with the accompanying drawings.

DETAILED DESCRIPTION OF THE INVENTION

Figure 1:
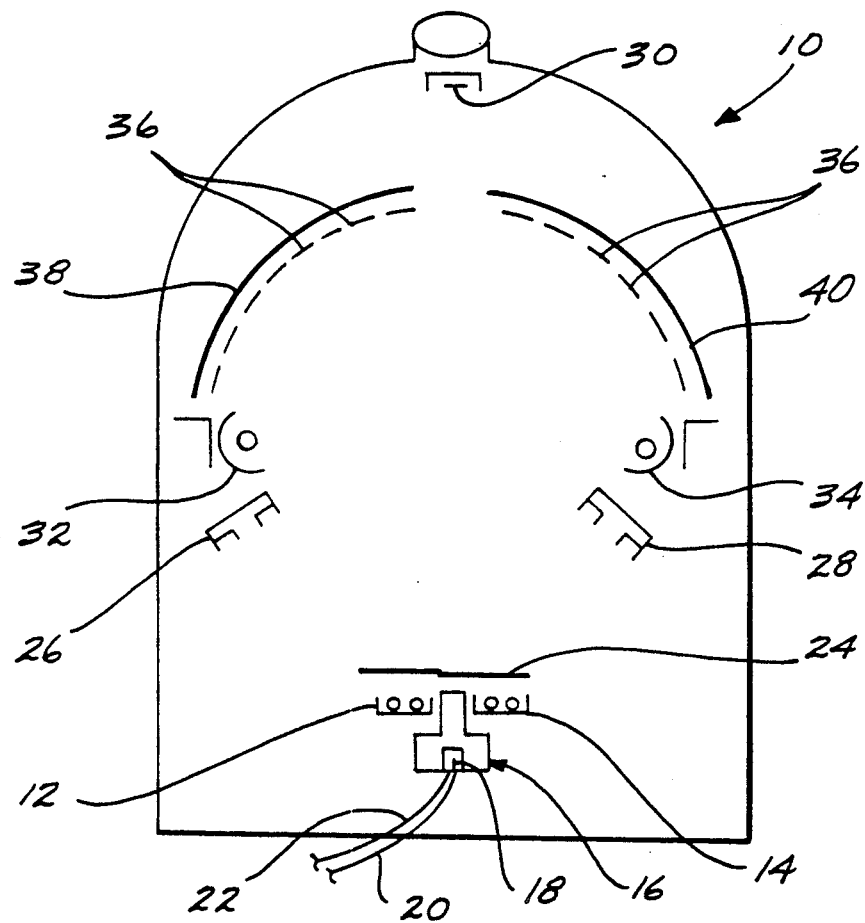
FIG. 1 is a schematic view of a vacuum vapor deposition chamber that includes an apparatus for evaporating material selected from semiconductors and insulators formed in accordance with the present invention.

Referring to FIG. 1, a vacuum evaporation chamber 10 for the production of copper indium diselenide (CIS) thin films on a glass substrate is illustrated. The CIS thin film is used in the production of high efficiency photovoltaic cells. While the present invention is described below with reference to the production of CIS thin films, there are other semiconductive and non-conductive materials that can be vacuum evaporated using the apparatus and method of the present invention. By way of example, materials that can be evaporated in accordance with the present invention include selenium, antimony, cadmium sulfide, zinc sulfide, tellurium, sulfur, phosphorous and silicon monoxide, that is, elements generally of groups II or VI of the Periodic Table.

Located in the lower portion of evaporation chamber 10 is indium source 12 and copper source 14. Indium source 12 and copper source 14 are water cooled copper crucibles that are lined with molybdenum to prevent sticking of the indium or copper to the crucible. Such crucibles are generally known as liners and are available from commercial sources. Associated with indium source 12 and copper source 14, though not shown, are individual electron guns that provide electron beams for evaporating the indium and copper. The indium and copper used are generally pure forms to insure purity of the condensed film.

Situated between indium source 12 and copper source 14 is selenium vapor source 16, the crucible of the present invention. Selenium vapor source 16 includes thermocouple 18 attached to thermocouple lead line 20 through the bottom of vapor source 16, and electric source lead line 22 connected to a voltage source (not shown). Directly above indium source 12, copper source 14 and selenium vapor source 16 is shutter 24. Shutter 24 includes three individual gates that when closed serve to prevent vapor from leaving the sources.

Electron impact emission spectrometers (EIES) 26 and 28 are positioned above shutter 24. EIES 26 and 28 monitor the evaporation rate of indium and copper in a conventional manner. It should be understood that generally one electron impact emission spectrometer is sufficient to monitor the evaporation rate of copper and indium. The rate of evaporation of selenium is measured by monitoring changes in the mass of a quartz crystal 30 positioned near the top of evaporation chamber 10. The mass of quartz crystal 30 is affected by the amount of selenium deposited thereon. Apertures and shields (not shown) are used to prevent deposition of copper or indium on the crystal. Changes in mass can be detected by measuring changes in the acoustic impedance of the quartz crystal.

Above EIES 26 and 28 are a pair of substrate heaters 32 and 34. Substrate heaters 32 and 34 are radiant heat sources, such as quartz lamps that are used to control the temperature of deposition substrates 36 described below. Control of the temperature of substrates 36 is needed to control the selective condensation of the indium, selenium, and copper vapor onto the substrates.

Positioned above substrate heaters 32 and 34 and below quartz crystal 30 are substrates 36 that are held in place by substrate supports 38 and 40. The composition, shape, and size of the substrate will depend on the particular end-use application. Prior to depositing the indium, selenium, and copper onto substrates 36, they are cleaned using a combination of an ultrasonic bath wash in a detergent solution followed by an ionized water rinse and a vapor degreasing in a mixture of methyl alcohol and trichloro-trifluoroethylene available under the trademark FREON ®. For photovoltaic cell use, the cleaned substrates 36 can be provided with a patterned molybdenum back contact prior to deposition of the indium, selenium, and copper.

In accordance with the present invention, selenium vapor source 16 is provided with an electric heat source that has a unique combination of thermal expansion and mechanical expansion characteristics. As described in more detail below with respect to one embodiment, the electric heat source formed in accordance with the present invention exhibits a fractional change in length per degree change in temperature that is less than the coefficient of thermal expansion of the material that makes up the heat source.

Figure 2:
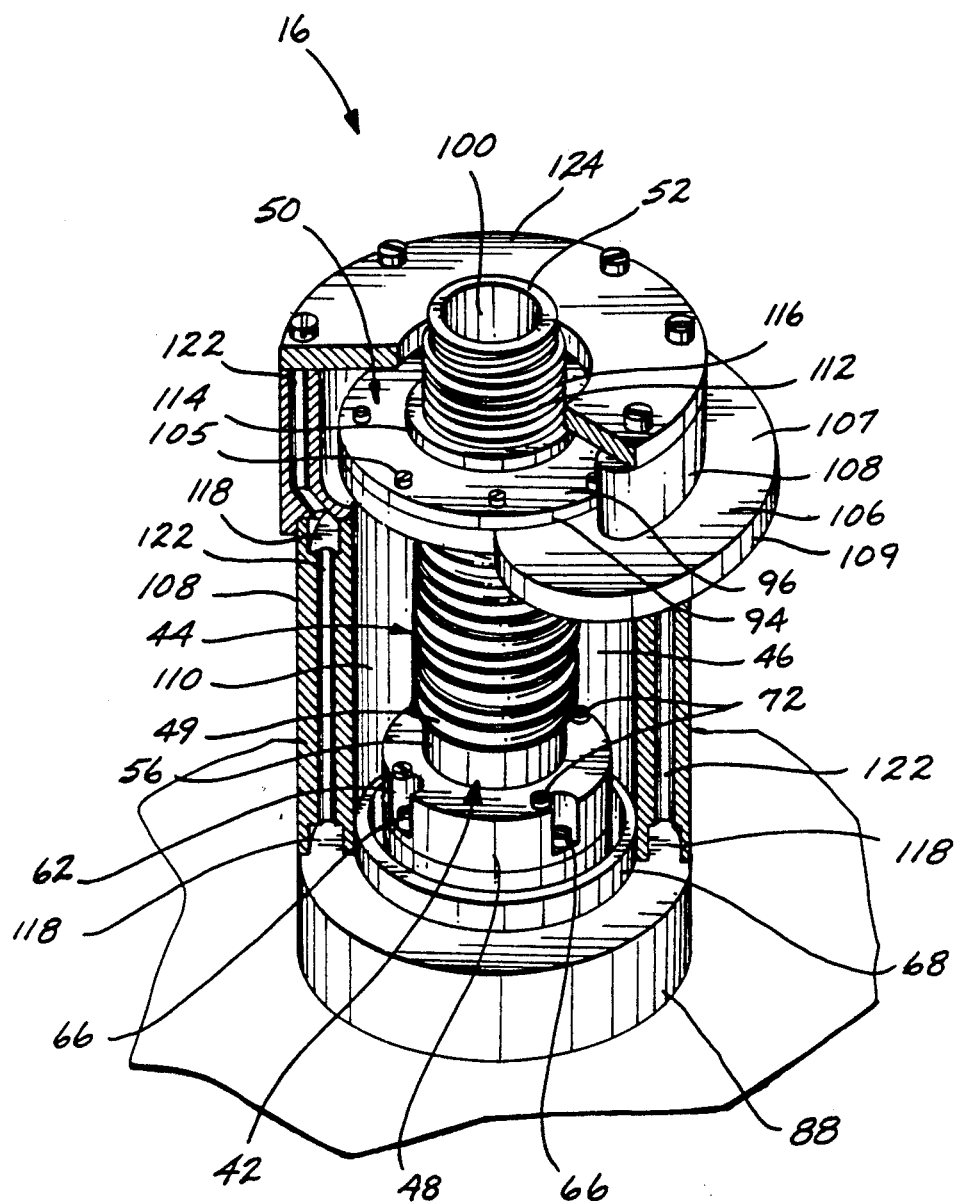
FIG. 2 is a perspective view with a portion cut away of a crucible of the present invention.
Figure 3:
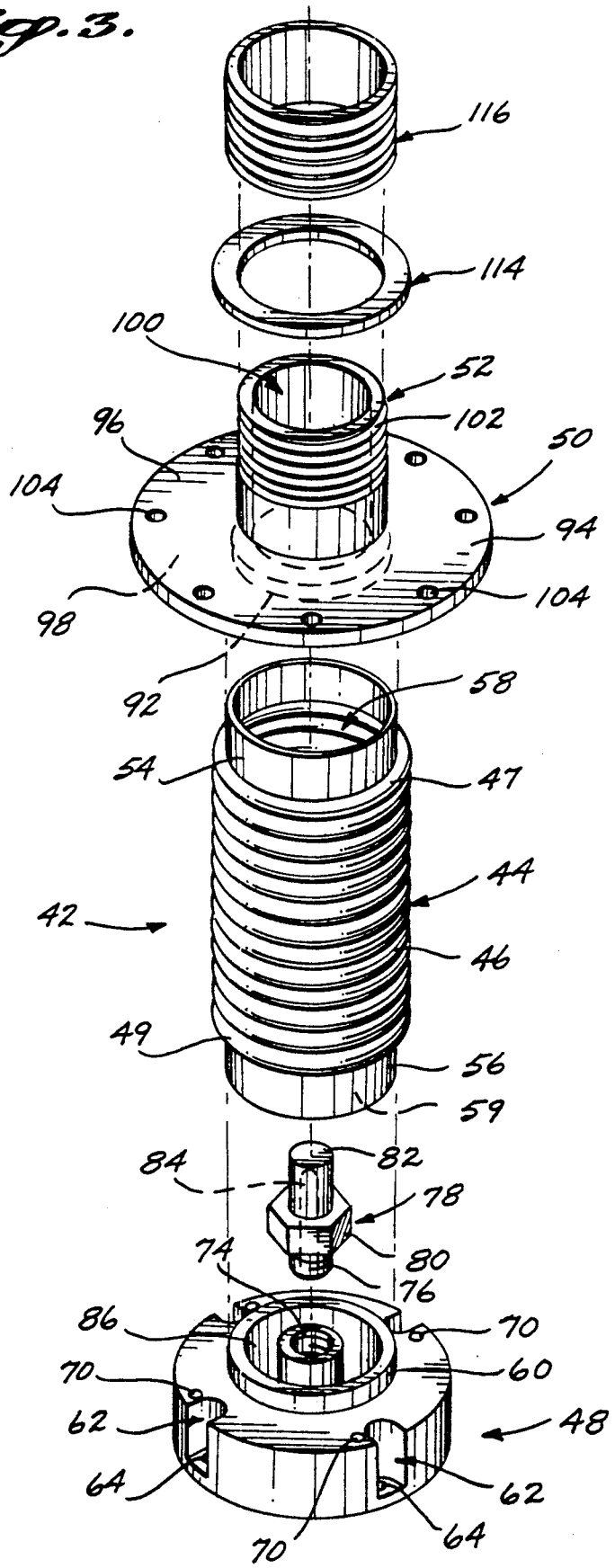
FIG. 3 is an exploded view of the crucible of FIG. 2.
Figure 4:
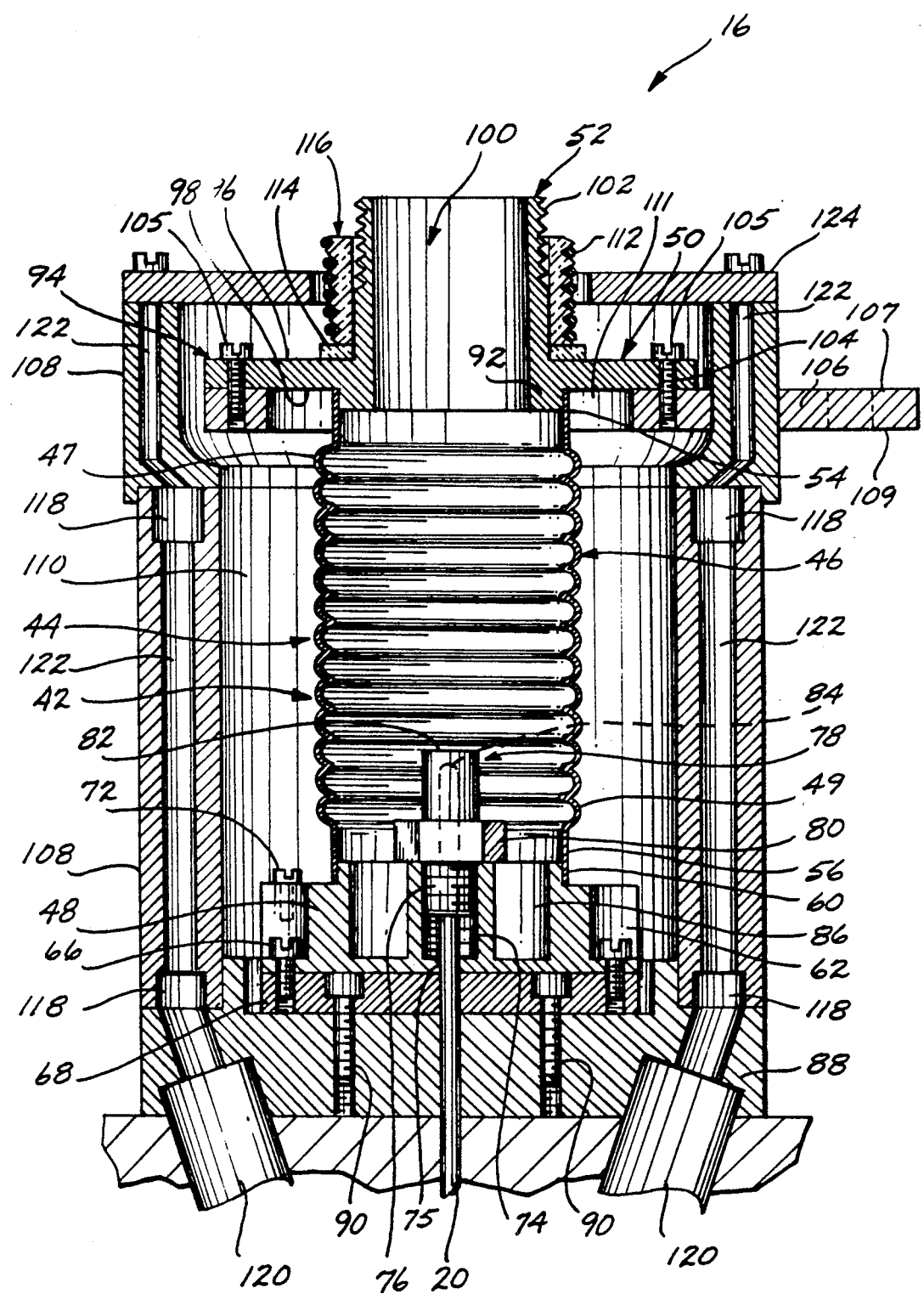
FIG. 4 is an elevation view of a cross section of the crucible of FIG. 2.

Referring to FIGS. 2, 3, and 4, selenium vapor source 16 in FIG. 1 includes bellows heat source 42 having a plurality of sidewall corrugations 46 (i.e., a bellows 44); a bottom 48; a top 50; and a nozzle 52.

The corrugations 46 are rib-shaped to allow flexibility, expansion and compression. Bellows 44 includes a circular neck or top 54 that extends upward from the uppermost corrugation 47. A bore 58 passes through the top 54 into the interior of source 42. A base 56 extends downward from the lowermost corrugation 49 and also includes a circular neck similar to that of top 54. Bellows base 56 also includes a bore 59 that passes into the interior of source 42.

The resistance of the sidewalls to current creates heat sufficient to melt the selenium contained in the source. Made from stainless steel at about 0.003 inches, the wall should be thick enough to avoid puncturing under normal use, while at the same time providing the desired heating capacity and flexibility. Other suitable materials for the source include nickel chromium alloys, nickel iron alloys, nickel copper alloys, nickel cobalt alloys, brass, aluminum, beryllium, copper, or nickel. A primary concern in selecting an appropriate material for the source is the compatibility of the material with the material to be evaporated (i.e., dispensed from the source). For selenium, the source is typically nickel chromium alloy or stainless steel. One commercial source of bellows 44 useful in the present invention is Miniflex Corporation of Ventura, Calif.

The bottom 48 is generally a circular disk having a planar bottom and a substantially planar top including the features described below. For the selenium source, the bottom 48 has a diameter of about 1.7 inches and is about 0.45 inches thick. Bottom 48 can be machined out of any material described above with respect to bellows 44. Four circular counterbore notches 62 are uniformly spaced around its periphery. The centers of the counterbore notches 62 are offset from the periphery of bottom 48 a distance less than the radius of the counterbore notches 62. Accordingly, counterbore notches 62 each provide an opening through the peripheral wall of bottom 48. The bottom of each counterbore notch 62 includes a screw hole 64 that passes through the balance of bottom 48 to receive screws 66 that attach bottom 48 to a clamp 68. Adjacent each counterbore notch 62, a tap hole 70 receives a panhead screw 72. Tap holes 70 are positioned relative to counterbore notches 62 such that the head of each panhead screw 72 protrudes over a portion of the top of a counterbore notch 62. In this manner, panhead screws 72 prevent screws 66 from inadvertently falling out of counterbore notches 62 before they are threaded into clamp 68.

A circular upstanding rib 60 forms bellows seat. The outer diameter is substantially the same as the inner diameter of base 56 so that the base 56 will fit snugly for soldering or welding. Welding is preferred for high temperature operation.

The bottom 48 also includes an internally threaded bore 74, tapped to a depth that is approximately the same as the depth of notches 62. A smaller bore 75 extends from the bottom of bore 74 through the bottom 48. The bore 74 receives the threaded end 76 of a thermocouple well 78, which includes a well nut 80 above end 76 and a cylindrical closed end 82. The thermocouple well 78 includes a cavity 84 passing through the center of threaded end 76, well nut 80, and a portion of closed end 82. Cavity 84 has dimensions that allow it to receive a conventional thermcouple.

A circular channel 86 is machined into the planar upper surface of bellows bottom 48 between bellows seat 60 and threaded bore 74, and defines a selenium well 86 between the outer wall of threaded bore 74, and the inner wall of bellows seat 60 for retaining the material to be evaporated in the source 16.

The lower current clamp 68 connects the source to one terminal of a conventional voltage source (not shown). A heat sink 88 is attached to lower current clamp 68 by screws 90.

Top 50 includes a circular plate 94 having a diameter of about 2.25 inches and a thickness of about 0.12 inches. The plate 94 includes an upper planar surface 96 and a lower planar surface 98. A circular rib 92 centered on the lower planar surface 98 extends downwardly to form bellows seat 92 to which the bellows 44 is affixed.

Centered and extending upward from upper planar surface 96 is nozzle 52 having a circular bore 100. Equally spaced around the periphery of the plate 94 are eight screw holes 104, to receive screws 105 to secure the top 50 to an upper current clamp 106.

The upper current clamp 106 is a flat plate in the general shape of an ellipse having an upper surface 107, a lower surface 109, and a bore 111 through which bellows 44 and bellows bottom 48 can pass. The bore 111 in upper current clamp 106 is not so large that circular plate 94 can pass therethrough, so it rests on the upper surface 107 of the clamp 106, and is attached with screws 105. The upper current clamp 106 also includes a cutout for allowing a fluid-cooled jacket 108 to pass through upper current clamp 106. Clamp 106 is connected to the other terminal of the voltage source to complete the circuit through the source. When powered, the source heats the selenium conductively. For stainless steel, an electric potential of about 5 volts and a current of about 30 amps (i.e., 150 watts) develops a temperature of about 250° C. in the selenium. The exact voltages, currents and temperatures will depend on the temperature of active cooling used with the device, the resistance of the bellows, and the thermal conductivity of the material in the source.

Changes in the temperature cause expansion or contraction of the metal which are compensated for by expansion or contraction of the corrugations. The bellows exhibits a fractional change in the length with respect to a one degree change in the temperature that is less than the coefficient of linear thermal expansion of the material from which the bellows is manufactured. Since top 50 is rigidly fixed to upper current clamp 106 and bottom 48 is rigidly fixed to lower current clamp 68, without the compression or expansion of corrugations 46, the thermal expansion or compression of bellows 44 would create stresses that would result in cracking or buckling of the source. Cracking or buckling of the source is undesirable because it causes the heat generation by the bellows to be less predictable and controllable. For example, hot or cold spots are more likely to occur.

Because the bellows is in direct contact with the selenium, changes in the electric potential (and temperature of the bellows) are translated quickly into a change in the temperature of the selenium.

Condensation of the evaporant on nozzle 52 is undesirable, but can be controlled by providing an independent electrically isolated, resistance heating coil 112 around the nozzle 52. An exemplary coil includes a 30-mil diameter nichrome alloy (20 percent chromium/80 percent nickel). An insulated washer 114 fits around the nozzle 52 and rests on upper planar surface 56 of the top 50 to provide the electrical isolation while an insulating sleeve 116 dimensioned to slide over and around nozzle 52 isolates it.

Further control of the temperature of the heat source and selenium can be achieved by using fluid-cooled jacket 108 surrounding the bellows 44 and nozzle 52. Cooling jacket 108 is conventional and includes channels 118 that contain and supply the coolant from a source 120 to a plurality of cavities 122.

A radiation shield 124 protects the nozzle 52 from external radiation heat sources, such as the substrate heaters. Radiation shield 124 is a flat circular plate that is attached to the top of jacket 108, having a bore passing through its center that allows the top of nozzle 52 to extend there through.

Although the present invention has been disclosed in respect to a preferred embodiment and modifications thereto, those of ordinary skill in the art will understand that further changes can be made within the scope of the claims that follow. The apparatus and method of the present invention have application in other end uses, for example, in the production of silicon wafers for the semiconductor industry. The apparatus and method of the present invention can also be used to evaporate conductive materials; however, to do so, the bellows must be made from materials capable of withstanding the higher vaporization temperatures generally associated with conductors. Since the conductive material would be in direct contact with the current carrying bellows, the effect the conductive material has on the electric potential and electric current flow through the bellows must be taken into consideration. Accordingly, the scope of the invention should be determined entirely by reference to the claims that follow.

I claim:

1. An evaporator for a high vacuum deposition chamber, the evaporator comprising:
   an electric heat source for heating a material, the heat source including a bellows for heating the material by direct contact, the bellows having a top end and a bottom end, and a length wherein the fractional change of the length of the bellows per degree change in temperature is less than the coefficient of thermal expansion for the material from which the bellows is made;
   an upper means for attaching the top end to a voltage source and a lower means for attaching the bottom end to a voltage source such that when an electric potential is established between the upper means and the lower means, electric current flows through the bellows; and
   an open end in the heat source for allowing the material to escape.

2. The evaporator of claim 1, wherein the bellows enables the heat source to mechanically expand and compress during thermal cycling.

3. The evaporator of claim 2, wherein the heat source is made from a metal selected from the group consisting of nickel chromium alloys, nickel iron alloys, nickel copper alloys, nickel cobalt alloys, brass, aluminum, beryllium copper, nickel, and stainless steel.

4. The evaporator of claim 1, further comprising a thermocouple for monitoring the temperature of molten materials in the evaporator.

5. The evaporator of claim 1, wherein the heat source is in direct contact with the material.

6. The evaporator of claim 1, wherein the heat source includes a nozzle for allowing evaporated material to escape the heat source into the chamber, the nozzle including means for adjusting the temperature of the nozzle.

7. The evaporator of claim 6, wherein the means for adjusting the temperature of the nozzle includes an electric heating coil around the nozzle.

8. The evaporator of claim 2, wherein the bellows is cylindrical and includes a plurality of sidewall corrugations between a top end of the bellows and a bottom end of the bellows.

9. The evaporator of claim 8, wherein the top end and bottom end are attached to a voltage source such that an electric potential can be established between the top end and the bottom end.

10. The evaporator of claim 8, wherein the top end and the bottom end are separated by a distance that is fixed.

11. An evaporator for a high vacuum deposition chamber, the evaporator comprising:
   a boat for retaining material in an unevaporated form;
   a nozzle for allowing the evaporated material to enter the chamber from the boat;
   a resistance heater, including a bellows that has an open top end and a bottom end for heating the material in the boat by direct contact; and
   an upper means for attaching the top end to a voltage source and a lower means for attaching the bottom end to a voltage source such that when an electric potential is established between the upper means and the lower means, electric current flows through the bellows.

12. The evaporator of claim 11, further comprising a nozzle heater for adjusting the temperature of the nozzle means.

13. The evaporator of claim 12, wherein the heater includes an electric heating coil around the nozzle.

14. A method for evaporating a material, comprising the steps:
   placing material in a metal bellows;
   heating the bellows by passing a current through the bellows to heat the material by conduction; and
   evaporating the material.

15. The method of claim 14, further comprising the step of mechanically compensating for thermal expansion and contraction of the heat source during thermal cycling by corrugating the metal.

16. The method of claim 15, wherein the evaporating step is carried out under vacuum conditions.

17. The method of claim 16, wherein the material to be evaporated is selenium.

18. The evaporator of claim 1, wherein the electric heat source heats the material to a temperature of about 250° C.

19. The evaporator of claim 11, wherein the resistance heater heats the material to a temperature of about 250° C.

20. The evaporator of claim 1, further comprising an evaporant well attached to the bottom end of the bellows.

21. The evaporator of claim 20, further comprising a thermocouple extending through the evaporant well into the bellows.

22. The evaporator of claim 6, further comprising an insulated washer between the nozzle and the means for adjusting the temperature of the nozzle.

23. The evaporator of claim 6, wherein the nozzle includes an open end having an outer surface that is threaded.

24. An evaporator for a high vacuum deposition chamber, the evaporator comprising:
   a bellows having an open top end and an open bottom end;
   a nozzle having one end attached to the top end, and a threaded end opposite the end attached to the top end;
   a well for evaporant attached to the bottom end;
   a thermocouple extending through the well and into the bellows;
   a heating coil positioned around the nozzle;
   an insulated washer between the nozzle and the heating coil; and
   an upper means for attaching the top end to a voltage source and a lower means for attaching the bottom end to a voltage source such that when an electric potential is established between the upper means and the lower means, electric current flows through the bellows.

* * * * *